United States Patent [19]  [11]  4,299,912
Shiba et al.  [45]  Nov. 10, 1981

[54] PROCESS FOR THE PRODUCTION OF PRINTING PLATES

[75] Inventors: Keisuke Shiba; Sho Nakao; Tadao Toyama, all of Shizuoka, Japan

[73] Assignee: Fuji Photo Film Co., Ltd., Minami-ashigara, Japan

[21] Appl. No.: 176,154

[22] Filed: Aug. 7, 1980

[30] Foreign Application Priority Data

Aug. 7, 1979 [JP] Japan ................................. 54-100596

[51] Int. Cl.$^3$ .............................................. G03F 7/02
[52] U.S. Cl. ................................... 430/302; 430/156; 430/502; 430/273
[58] Field of Search ................. 430/302, 156, 502, 273

[56] References Cited

U.S. PATENT DOCUMENTS 3,620,737  11/1971  Etter et al. ........................... 430/302

FOREIGN PATENT DOCUMENTS 1187980  4/1970  United Kingdom ................ 430/302
1227603  4/1971  United Kingdom ................ 430/302

Primary Examiner—Won H. Louie, Jr.
Attorney, Agent, or Firm—Sughrue, Mion, Zinn, Macpeak & Seas

[57] ABSTRACT

A process for producing a lithographic printing plate from a light-sensitive lithographic printing plate comprising a support, a non-silver light-sensitive layer which is provided on the support and which forms a water-insoluble lipophilic image and a gelatino-silver halide light-sensitive emulsion layer on the non-silver light-sensitive layer, which process comprises the steps of:

(a) imagewise exposing the light-sensitive lithographic printing plate;
(b) developing the gelatino-silver halide light-sensitive emulsion layer;
(c) exposing the non-silver light-sensitive layer to light;
(d) washing out the gelatino-silver halide light-sensitive emulsion layer in the presence of a proteolytic enzyme; and
(e) developing the non-silver light-sensitive layer.

10 Claims, 1 Drawing Figure

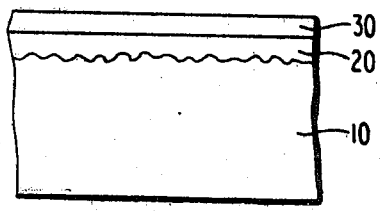

PROCESS FOR THE PRODUCTION OF PRINTING PLATES

BACKGROUND OF THE INVENTION

1. Field of the Invention

This invention relates to a method for producing a lithographic printing plate, more particularly to an improved plate-making method for obtaining a lithographic printing plate from a light-sensitive lithographic printing plate comprising a support, a non-silver light-sensitive layer and a gelatino-silver halide light-sensitive emulsion layer.

2. Description of the Prior Art

A light-sensitive lithographic printing plate comprising a support with a hydrophilic surface, such as an aluminum plate, a non-silver light-sensitive layer, such as a light-sensitive layer comprising an o-quinonediazide compound provided on the support and a gelatino-silver halide light-sensitive emulsion layer provided on the non-silver light-sensitive layer is known in the art as described, for example, in British Patent No. 1,227,603.

A method of producing a lithographic printing plate from such a light-sensitive lithographic printing plate fundamentally comprises the steps of:

(a) imagewise exposing the gelatino-silver halide light-sensitive emulsion layer, (b) developing it to form a silver image, (c) masking the silver image so obtained and exposing the non-silver light-sensitive layer to light, (d) washing out the layer containing the silver image (i.e., the imagewise exposed and developed gelatino light-sensitive emulsion layer), and (e) developing the non-silver light-sensitive layer.

In the prior art plate-making method, the washing-out at step (d) has usually been carried out by processing with hot water. The gelatino-silver halide emulsion layer cannot generally be dissolved and completely removed by such a treatment, i.e., usually it is removed in the form of small films which are remained undissolved. Thus, such a prior art plate-making method suffers from the disadvantage that where the washing-out is carried out mechanically in a processing apparatus, small pieces of the gelatino-silver halide emulsion layer as described above accumulate in the processing liquid, making it necessary to frequently change the processing liquid. Further, it has the disadvantage that the lithographic printing plate obtained by washing with processing liquid in which the identified small pieces have accumulated shows reduced lipophilic property in image areas, leading to a number of wasted sheets during the initial operation of printing.

SUMMARY OF THE INVENTION

This invention is directed to an improvement in a method for producing a lithographic printing plate from a light-sensitive lithographic printing plate comprising a support, a non-silver light-sensitive layer on the support and a gelatino-silver halide light-sensitive emulsion layer on the non-silver light-sensitive layer.

An object of this invention is to provide a plate-making method wherein the step of washing out the gelatino-silver halide photographic emulsion layer in the above plate-making method is improved.

Another object of this invention is to provide a plate-making method wherein the processing capacity of a processing liquid for use in the washing-out of the gelatino-silver halide emulsion layer has been increased.

A further object of this invention is to provide a plate-making method which permits the production pf a lithographic printing plate of excellent lipophilic property in image area.

It has now been found that the above objects can be attained by carrying out the washing-out of the gelatino-silver halide light-sensitive emulsion layer in the presence of one or more proteolytic enzymes.

Thus, this invention provides a method of producing a lithographic printing plate from a light-sensitive lithographic printing plate comprising a support with a hydrophilic surface, a non-silver light-sensitive layer which is provided on the support which forms an insoluble lipophilic image, and a gelatino-silver halide light-sensitive emulsion layer on the non-silver light-sensitive layer, which method comprises the steps of:

(a) imagewise exposing the light-sensitive lithographic printing plate, (b) developing the gelatino-silver halide light-sensitive emulsion layer, (c) exposing the non-silver light-sensitive layer to light, (d) washing out the gelatino-silver halide light-sensitive emulsion layer, and (e) developing the non-silver light-sensitive layer, wherein the washing-out of step (d) is carried out in the presence of one or more proteolytic enzymes.

BRIEF DESCRIPTION OF THE DRAWING

The FIGURE is a sectional view of a light-sensitive lithographic printing plate useful in this invention.

DETAILED DESCRIPTION OF THE INVENTION

In producing a printing plate by continuous processing according to the above-described prior art method using an automatic developing machine there has sometimes been obtained printing plates with low quality image areas, printing plates which have inferior lipophilic property in image areas (particularly in an atmosphere of high humidity) or printing plates which yield spot-like stains in non-image area or spot-like irregularities formed of ink in image areas.

The method of this invention removes the above problems encountered in using automatic developing machines and enables one to easily obtain printing plates which provide excellent performance.

The fundamental structure of the light-sensitive lithograhic printing plate for use in this invention is as illustrated in the FIGURE, that is, it comprises a support 10 having a hydrophilic surface, a non-silver light-sensitive layer 20 which is on support 10 and forms a water-insoluble lipophilic image and a gelatino-silver halide light-sensitive emulsion layer 30 on the light-sensitive layer 20.

Between the non-silver light-sensitive layer 20 and the gelatino-silver halide light-sensitive emulsion layer 30 there can be provided one or more intermediate layers, if desired, containing a hydrophilic polymer such as gelatin, polyvinyl alcohol, polyvinyl imidazole, etc., as described, for example, in U.S. Pat. No. 3,245,973, U.S. Defensive Patent Application T-870,022 and Japanese Patent Publication 23721/72. Furthermore, a protective layer can be provided on the gelatino-silver halide light-sensitive emulsion layer 30, if desired.

Each layer constituting the light-sensitive lithographic printing plate for use in this invention will hereinafter be explained in detail.

The support for use in this invention has a hydrophilic surface; any such support as conventionally used in lithographic printing plates can be used in this invention.

Such supports include paper, plastic (e.g., polyethylene, polypropylene, polystyrene, etc.) laminated paper, plates of metals such as aluminum (including aluminum alloys), zinc, iron and copper, films of plastics such as cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate and polyvinyl acetal, and the above metal laminated or vapor-deposited onto paper or a plastic film. Of these supports, an aluminum plate or a composite sheet including an aluminum layer are preferably used.

In order to render the surface of the support hydrophilic, it will sometimes be required to use a surface treatment or to provide a hydrophilic layer thereon. When necessary, various conventional methods can be employed to render the surface of the support hydrophilic. For example, in the case of supports having a plastic surface, surface treating methods such as a chemical treatment, a discharge treatment, a flame treatment, ultraviolet ray treatment, high frequent wave treatment, glow discharge treatment, active plasma treatment and laser treatment (as described, for example, in U.S. Pat. Nos. 2,764,520, 3,497,407, 3,145,242, 3,376,208, 3,072,483, 3,475,193 and 3,360,448 or British Patent 788,365) can be employed. If desired or necessary, after the surface treatment a hydrophilic layer can be overcoated as described, for example, in U.S. Pat. No. 2,649,373, Japanese Patent Application (OPI) Nos. 40890/78 and 61643/78 (the term "OPI" as used herein refers to a "published unexamined Japanese patent application"), etc.

In the case of a metal support, particularly those supports having an aluminum surface, it is preferred to use a surface treatment such as, for example, graining, dipping in an aqueous solution of sodium silicate, potassium fluorozirconate, phosphates or the like, or anodizing.

Additionally, aluminum plates which have been treated by dipping in an aqueous solution of sodium silicate after sand graining as described in U.S. Pat. No. 2,714,066 and aluminum plates which have been firstly anodized and then dipped in an aqueous solution of a silicic acid alkali metal salt as described in U.S. Pat. No. 3,181,461 are also preferably used in this invention.

The above anodization is carried out by passing a current through the aluminum plate in an aqueous or non-aqueous solution of an inorganic acid, e.g., phosphoric acid, chromic acid, sulfuric acid, boric acid, etc., an organic acid, e.g., oxalic acid, sulfamic acid, etc., or the salt thereof, or in a solution comprising two or more thereof, particularly preferably in an aqueous solution of phosphoric acid, sulfuric acid or a mixture thereof.

The silicate electric deposition as described in U.S. Pat. No. 3,658,662 is also effectively used. Moreover, an aluminum plate which has been electrolyzed in an electrolyte of hydrochloric acid using alternating current and then anodized in an electrolyte of sulfuric acid as described in British Patent No. 1,208,224 is preferred.

Further, it is preferred, from the point of preventing scum during printing, to provide an undercoating layer of a cellulose based resin containing a water-soluble salt of a metal on an aluminum plate anodized as described above, e.g., zinc, etc., as described in U.S. Pat. No. 3,860,426.

The non-silver light-sensitive layer which is provided on the support and yields a lipophilic image includes light-sensitive layers as are used in conventional light-sensitive lithographic printing plates (also called a "Pre-Sensitized Plate" and referred to herein merely as a "PS plate"). By the term "lipophilic" in lipophilic image as used in this invention is meant that the image repels water for wetting in printing but receives oily ink.

Examples of compositions constituting such a light-sensitive layer are as follows:

(1) Compositions comprising one or more diazo resins

While any water-soluble or water-insoluble diazo resins as exemplified by condensates of p-diazodiphenylamine and paraformaldehyde can be used, those which are insoluble in water and soluble in conventional organic solvents such as 2-methoxyethanol, methanol, ethylene chloride, etc., are preferably used.

Especially preferred diazo compounds are those compounds containing at least two diazo groups in the molecule, such as a phenol salt, a fluorocapric acid salt or a sulfonic acid salt (e.g., triisopropylnaphthalenesulfonic acid, 4,4-bisphenylsulfonic acid, 5-nitro-o-toluenesulfonic acid, 5-sulfosalicylic acid, 2,5-dimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprylnaphthalenesulfonic acid, 1-naphthol-5-sulfonic acid, 2-methoxy-4-hydroxy-5-benzoylbenzenesulfonic acid, para-toluenesulfonic acid, etc.) of a condensate of p-diazophenylamine and formaldehyde or acetaldehyde. Other preferred diazo resins include condensates of 2,5-dimethoxy-4-p-tolylmercaptobenzenediazonium and formaldehyde and condensates of 2,5-dimethoxy-4-morpholinobenzenediazonium and formaldehyde or acetaldehyde, including the salts thereof as described above.

In addition, the diazo resins described in British Patent No. 1,312,925 are preferred.

The diazo resin can be used per se as a light-sensitive material in the formation of a resist, but it is preferably used in combination with a binder.

Various polymers preferred for use herein as such a binder which contain a group or groups as a hydroxy, amino, carboxyl, amide, sulfonamide, active methylene, thioalcohol or epoxy group are preferred. These preferred binders include shellac as described in British Patent No. 1,350,521, polymers containing recurring units of hydroxyethyl acrylate or hydroxyethyl methacrylate as described in British Patent No. 1,460,978 and U.S. Pat. No. 4,123,276, polyamide resins as described in U.S. Pat. No. 3,751,257, phenol resins and polyvinyl acetal resins, e.g., polyvinyl formal resin and polyvinyl butyral resin as described in British Patent No. 1,074,392, linear polyurethane resins as described in U.S. Pat. No. 3,660,097, phthalated resins of polyvinyl alcohol, epoxy resins obtained by the condensation of bisphenol A and epichlorohydrin, polymers containing an amino group (or groups) such as polyaminostyrene and polyalkylaminoacrylate or methacrylate and celluloses such as cellulose acetate, cellulose alkyl ether, cellulose acetate phthalate, etc.

The binder content is preferably such that it comprises 40 to 95% by weight of the light-sensitive resist forming composition. As the amount of the binder increases (that is, the amount of the diazo resin decreases), light-sensitivity naturally increases, but stability with time decreases. The most suitable binder content is from about 70% by weight to about 90% by weight, same basis.

To the composition comprising the diazo resin there can further be added, if desired, additives such as phosphoric acid, dyes, pigments, etc., as described in U.S. Pat. No. 3,236,646.

(2) Compositions comprising one or more o-quinonediazide compounds

Especially preferred o-quinonediazide compounds are o-naphthoquinonediazide compounds as described in U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709, 3,647,443, etc., and in the literature, such are most preferably used in the present invention.

Particularly preferred among these compounds are o-naphthoquinonediazidosulfonic acid esters or o-naphthoquinonediazidocarboxylic acid esters of an aromatic hydroxy compound and an o-naphthoquinonediazidosulfonic acid amide or an o-naphthoquinonediazidocarboxylic acid amide of an aromatic amino compound. In particular, compounds obtained by esterification of a condensate of pyrogallol and acetone and o-naphthoquinonediazidosulfonic acid as described in U.S. Pat. No. 3,635,709, compounds obtained by esterification of a polyester containing a terminal hydroxy group or groups and o-naphthoquinonediazidosulfonic acid or o-naphthoquinonediazidocarboxylic acid as described in U.S. Pat. No. 4,028,111, and compounds obtained by esterification of a homopolymer of p-hydroxystyrene or a copolymer thereof with another monomer(s) copolymerizable therewith and o-naphthoquinonediazidosulfonic acid or o-naphthoquinonediazidocarboxylic acid as described in British Patent No. 1,494,043 are excellent.

While these o-quinonediazide compounds can be used singly, it is preferred to use them in combination with one or more alkali-soluble resins. Preferred alkali-soluble resins include novolak type phenol resins, in more detail, phenol-formaldehyde resins, o-cresolformaldehyde resins, m-cresol-formaldehyde resins, etc. Furthermore, it is more preferred to use a phenol resin as described above in combination with a condensate of phenol or cresol, both of which are substituted with an alkyl group containing 3 to 8 carbon atoms, and formaldehyde, such as a t-butylphenol-formaldehyde condensate, as described in U.S. Pat. No. 4,123,279.

The amount of the alkali-soluble resin(s) added is preferably from about 50% by weight to about 85% by weight, more preferably from about 60% by weight to about 80% by weight, based on the total weight of the light-sensitive resist forming composition.

To the light-sensitive resist forming composition comprising the o-quinonediazide compound there can be further added additives such as pigments, dyes, plasticizers, etc., as desired or necessary.

(3) Compositions comprising one or more light-sensitive azide compounds

Suitable light-sensitize azide compounds include aromatic azide compounds in which the azido group is linked directly or through a carbonyl group or sulfonyl group to an aromatic ring. On exposing these aromatic azide compounds to light, the azido group decomposes yielding nitrene and the nitrene formed undergoes various reactions which renders the compounds insoluble.

Preferred aromatic diazide compounds are those containing therein one or more groups such as an azidophenyl, azidostyryl, azidobenzoyl or azidocinnamoyl group, e.g., 4,4'-diazidochalcone, 4-azido-4'-(4-azidobenzoylethoxy)chalcone, N,N-bis-p-azidobenzal-p-phenylenediamine, 1,2,6-tri(4'-azidobenzoxy)hexane, 2-azido-3-chlorobenzoquinone, 2,4-diazido-4'-ethoxyazobenzene, 2,6-di(4'-azidobenzal)-4-methylcyclohexanone, 4,4'-diazidobenzophenone, 2,5-diazido-3,6-dichlorobenzoquinone, 2,5-bis(4-azidostyryl)-1,3,4-oxadiazole, 2-(4-azidocinnamoyl)thiophene, 2,5-di(4'-azidobenzal)cyclohexanone, 4,4'-diazidodiphenylmethane, 1-(4-azidophenyl)-5-furyl-2-penta-2,4-diene-1-one, 1-(4-azidophenyl)-5-(4-methoxyphenyl)-penta-1,4-diene-3-one, 1-(4-azidophenyl)-3-(1-naphthyl)propene-1-one, 1-(4-azidophenyl)-3-(4-dimethylaminophenyl)propane-1-one, 1-(4-azidophenyl)-5-phenyl-1,4-pentadiene-3-one, 1-(4-azidophenyl)-3-(4-nitrophenyl)-2-propene-1-one, 1-(4-azidophenyl)-3-(2-furyl)-2-propene-1-one, 1,2,6-tri(4'-azidobenzoxy)hexane, 2,6-bis(4-azidobenzylidine-p-t-butyl)cyclohexanone, 4,4'-diazidodibenzalacetone, 4,4'-diazidostilbene-2,2'-disulfonic acid, 4'-azidobenzalacetophenone-2-sulfonic acid, 4,4'-diazidostilbene-α-carboxylic acid, di(4-azido-2'-hydroxybenzal)acetone-2-sulfonic acid, 4-azido-benzalacetophenone-2-sulfonic acid, 2-azido-1,4-dibenzenesulfonylaminonaphthalene, 4,4'-diazido-stilbene-2,2'-disulfonic acid anilide and the like.

In addition to these low molecular weight aromatic azido compounds, azido group-containing polymers as described in Japanese Patent Publication Nos. 9047/69, 31837/69, 9613/70, 24915/70 and 25713/70 and Japanese Patent Application (OPI) Nos. 5102/75, 84302/75, 84303/75 and 12984/78 are suitably used.

These light-sensitive azide compounds are preferably used in combination with a polymeric binder or binders. Preferred binders include alkali-soluble resins, including natural resins such as shellac, rosin, etc., novolak type phenol resins such as phenol-formaldehyde resins, m-cresol-formaldehyde resins, etc., homopolymers of unsaturated carboxylic acids or copolymers thereof with other monomers copolymerizable therewith such as polyacrylic acid, polymethacrylic acid, a methacrylic acid-styrene copolymer, a methacrylic acid-methyl methacrylate copolymer, a styrene-maleic anhydride copolymer, etc., resins obtained by the partial acetalization of partial or wholly saponified polyvinyl acetate with an aldehyde, e.g., acetaldehyde, benzaldehyde, hydroxybenzaldehyde or carboxybenzaldehyde, polyhydroxystyrene and the like. Additionally, organic solvent-soluble resins, for example, cellulose alkyl ethers such as cellulose methyl ether, cellulose ethyl ether, etc., can be used as a binder.

The binder is preferably added in an amount of from about 10% by weight to about 90% by weight based on the total weight of the light-sensitive composition comprising the azide compound.

To the composition comprising the light-sensitive azide compound there can further be added, as desired or necessary, additives, such as, e.g., dyes, pigments, plasticizers, such as phthalic acid esters, phosphoric acid esters, aliphatic carboxylic acid esters, glycols, sulfonamides, etc., sensitizers such as Michler's ketone, 9-fluorenone, 1-nitropyrene, 1,8-dinitropyrene, 2-chloro-1,2-benzanthraquinone, 2-bromo-1,2-benzanthraquinone, pyrene-1,6-quinone, 2-chloro-1,8-phthaloylnaphthalene, cyanoacridine, etc.

(4) Compositions comprising one or more polymers containing a

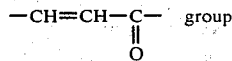 group in the main or side chain thereof

Examples of such are compositions composed of light-sensitive polymers such as polyesters, polyamides, and polycarbonates which contain in their main or side chain the light-sensitive group

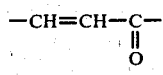

as described, for example, in U.S. Pat. Nos. 3,030,208, 3,707,373 and 3,453,237, compositions composed of light-sensitive polyesters derived from (2-propelidene)-malonic acid (such as cinnamylidenemalonic acid) and difunctional glycols as described, for example, in U.S. Pat. Nos. 2,956,878 and 3,173,787, cinnamic acid esters of hydroxy group-containing polymers such as polyvinyl alcohol, starch, cellulose and like compounds as described, for example, in U.S. Pat. Nos. 2,690,966, 2,752,372 and 2,732,301, etc.

To these compositions there can further be added, as desired or necessary, sensitizers, stabilizers, plasticizers, pigments, dyes, etc.

(5) Photopolymerizable compositions comprising one or more addition-polymerizable unsaturated compounds Such compositions preferably comprise (a) a vinyl monomer containing at least two terminal vinyl groups; (b) a photopolymerization initiator, (c) a polymeric binder, and mixtures thereof.

Vinyl monomers which can be used as Component (a) include an acrylic acid or methacrylic acid ester of a polyol, e.g., diethyleneglycol diacrylate or dimethacrylate, triethyleneglycol diacrylate or dimethacrylate, pentaerythritol triacrylate or trimethacrylate, trimethylolpropane acrylate or methacrylate, etc., bisacrylamides or bismethacrylamides such as methylenebisacrylamide or methylenebismethacrylamide and ethylenebisacrylamide or ethylenebismethacrylamide, unsaturated monomers containing a urethane group, for example, reaction products of a diol monoacrylate or diol monomethacrylate and a diisocyanate, such as di(2'-methacryloxyethyl)-2,4-trilenediurethane, di(2'-acryloxyethyl)-trimethylenediurethane, etc., as described in Japanese Patent Publications 5093/60, 14719/60 and 28727/69.

As Component (b), compounds including carbonyl compounds, organic sulfur compounds, persulfides, redox compounds, azo compounds, diazo compounds, halogen compounds, photoreducible dyes, etc., as described in J. Kosar, *Light-Sensitive Systems*, Chapter 5, pages 160 to 193 (published by John Wiley & Sons, Inc., New York, 1965) and as described in British Patent No. 1,459,563 can be used.

As Component (c), the binder, known polymers can be used. Representative examples of such binders are described in U.S. Pat. No. 4,072,527. In particular, chlorinated polyolefins as described in British Pat. No. 1,459,563 are especially preferred binders.

The weight ratio of Component (a) to Component (c) is 1:9 to 6:4. Component (b) is added in an amount of 0.5 to 10% by weight based on the weight of Component (a).

To the photopolymerizable composition there can further be added, as desired or necessary, heat-polymerization inhibitors, plasticizers, dyes and pigments.

Of the compositions as described above, Compositions (2), (3), (4) and (5) are preferred and Composition (2) is most preferred. These compositions are dissolved in organic solvents such as methyl ethyl ketone, cyclohexanone and the like and coated by conventional coating methods so that the dry weight of the composition is from about 0.1 g to about 5 g per m².

In a light-sensitive lithographic printing plate as used in a particularly preferred embodiment of this invention, the gelatino-silver halide light-sensitive emulsion layer is provided directly on the non-silver light-sensitive layer described above, and a water-insoluble lipophilic resin is dispersed in a fine particle form in the gelatino-silver halide light-sensitive emulsion layer.

"Lipophilic resins" as used herein can be identified by the following simple test:

The resin is coated in a dry thickness of 2μ or more (maximum thickness is of no consequence for this test) on a support and the contact angle θ at the surface of the resin so coated is measured by the "captive bubble method" described by Arthur W. Adamson, *Physical Chemistry of Surfaces*, pp. 342 to 344, published by John Wiley & Sons, New York (1967), i.e., the sample as obtained above is dipped in water at 24° C. and the surface thereof is brought into contact with fine particles (bubbles) of kerosene, suitably those having a diameter of 1 to 2 mm, the contact angle θ o/w of kerosene in water then being measured using a goniometer whereafter the sample is dipped in kerosene and the surface thereof is brought into contact with fine particles (bubbles) of water, suitably those having a diameter of 1 to 2 mm, the contact angle θ w/o then being measured. When the equation: $\theta = -[\theta\ o/w - \theta\ w/o]$ is positive, the resin is "lipophilic" in accordance with the present invention.

Such lipophilic resins which are substantially insoluble in water include resins as above listed as binders for use in the non-silver light-sensitive layer, e.g., shellac, polyamide resins, phenol resins, polyvinyl acetal resins, linear polyurethane resins, novolak type phenol resins, polyester resins, and, additionally, light-sensitive polymers such as polyvinyl cinnamate based resins, light-sensitive unsaturated polyester resins, etc.

Such a lipophilic resin is preferably dispersed as fine grains having a grain diameter of from 0.01μ to 10μ in the gelatino-silver halide light-sensitive emulsion. The amount of the lipophilic resin added is about 0.1 to about 20 parts by weight per 10 parts by weight of the hydrophilic colloid in the gelatino-silver halide light-sensitive emulsion, preferably 1 to 10 parts by weight and most preferably 2 to 5 parts by weight. The amount of the hydrophilic colloid (e.g., gelatin) in the gelatino-silver halide emulsion is about 30 to about 120 parts by weight, preferably 50 to 100 parts by weight, per 100 parts by weight of the silver halide. These lipophilic or hydrophilic resins can be a mixture of different resins.

The gelatino-silver halide emulsion may be selected from any conventional negative type emulsions or direct positive type emulsions.

As the silver halide, silver chloride, silver bromide, silver iodide and a mixture thereof as conventionally employed can be used. The average silver halide grain diameter is preferably from 0.01μ to about 5μ.

In order to provide a suitable or desired sensitivity to the silver halide, the grains thereof can be subjected to chemical sensitization, e.g., sulfur sensitization, reduction sensitization, sensitization using salts of noble metals such as Ir, Rh, Pt, etc., or spectral sensitization using sensitizing dyes. Silver halides of the surface latent image type and the inner latent image type can also be employed.

The emulsions used in the present invention can contain conventional additives as are typically employed in such emulsions in the prior art, as may be desired or necessary.

The use of a gelatino-silver halide light-sensitive emulsion layer in which one or more lipophilic resins as described above is/are dispersed produces strong adhesion between the gelatino-silver halide light-sensitive emulsion layer and the non-silver light-sensitive emulsion layer. Even where the gelatino-silver halide light-sensitive emulsion containing therein the lipophilic resin is directly coated on the non-silver light-sensitive layer and dried, problems caused by stripping-off of the gelatino-silver halide light-sensitive layer which occur during drying are eliminated.

The gelatino-silver halide light-sensitive emulsion layer is provided so that the dry weight is about 1 to about 10 g/m$^2$, preferably from 2 to 6 g/m$^2$. Conventional coating methods can be used, e.g., dip coating, air knife coating, curtain coating, hopper coating and extrusion coating as described in U.S. Pat. No. 2,681,294 can be used.

In one embodiment of this invention, an intermediate layer can be interposed between the gelatino-silver halide light-sensitive emulsion layer and the non-silver light-sensitive layer. The intermediate layer comprises one or more hydrophilic protective colloids and one or more lipophilic resins as described above dispersed therein. The intermediate layer is useful for improving the close contact of the non-silver light-sensitive layer and the gelatino-silver halide light-sensitive emulsion layer and for preventing undesirable reaction between these layers, and is also useful as an antihalation layer.

The thickness of the intermediate layer can be about 0.1 to 5μ, preferably 0.5 to 2μ.

As the hydrophilic protective colloid used in the intermediate layer, a hydrophilic polymer as is conventionally used in silver halide emulsions can be used. Examples of such hydrophilic polymer compounds are gelatin, gelatin derivatives, graft polymers of gelatin and other polymers, cellulose derivatives such as hydroxyethyl cellulose and carboxymethyl cellulose, proteins such as casein and albumin, sodium alginate, starch derivatives, partially acetalated products of polyvinyl alcohol, homo- or copolymers such as poly-N-vinyl pyrrolidone, polyacrylic acid, polyacrylamide, polyvinyl imidazole, polyvinyl pyrazole and the like.

The above gelatin derivatives include reaction products of gelatin and an isocyanate, an acid halide, an acid anhydride, acrylonitrile, an epoxy compound, vinylsulfonamide or the like as described in U.S. Pat. Nos. 2,614,928, 2,763,639, 3,132,945, 3,118,766, 3,186,846 and 3,312,553, Japanese Patent Publications Nos. 5514/64 and 26845/67, etc., and graft polymers of gelatin include those as described in U.S. Pat. Nos. 2,763,625, 2,831,767, 2,956,884, etc.

In the intermediate layer comprising such a hydrophilic protective colloid, the lipophilic resin can be used in an amount of 0.1 to 20 parts by weight per 10 parts by weight of the hydrophilic protective colloid. This permits the intermediate layer to be uniformly provided on the non-silver light-sensitive layer and the gelatino-silver halide light-sensitive emulsion layer to be provided on the intermediate layer. Therefore, there can be obtained a lithographic printing plate which yields good printed matter without deteriorating print resistance and oil sensitivity. In this embodiment, the lipophilic resin need not be incorporated in the gelatino-silver halide light-sensitive emulsion layer but can be present therein, if desired.

A lithographic printing plate is produced from the above light-sensitive lithographic printing plates as follows:

The light-sensitive lithographic printing plate is firstly imagewise exposed to light to form a latent image in the silver halide in the gelatino-silver halide light-sensitive emulsion layer. The latent image is then developed (First Development). Immediately after First Development (or after processing with a fixer), the non-silver light sensitive layer is exposed to the light which is active to the non-silver light-sensitive layer, e.g., UV light. Then washing-out processing is conducted to remove the total gelatino-silver halide light-sensitive emulsion layer. Thereafter, Second Development is carried out wherein either exposed or unexposed areas of the non-silver light-sensitive layer is dissolved and removed to expose the hydrophilic surface of the support, whereby the lithographic printing plate is obtained.

Second Development requires a processing liquid which is able to selectively dissolve either exposed or unexposed areas of the non-silver light-sensitive layer. Such a processing liquid can be chosen from developers which are conventionally used for the development of PS plates and developers similar thereto. For example, where the non-silver light-sensitive layer comprises an o-quinonediazide compound, an aqueous solution of sodium silicate and developers as described in U.S. Pat. No. 4,141,733 can be used. Also, the developer of Composition (1) is disclosed in U.S. Pat. No. 4,186,006, the developer of Composition (4) is disclosed in U.S. Pat. No. 3,707,373 and the developer of Composition (5) is disclosed in U.S. Pat. No. 3,458,311.

Development of the gelatino-silver halide light-sensitive emulsion layer is carried out by developing methods as are conventionally used for silver halide light-sensitive materials. Developing agents as can be used in this development include hydroquinone, catechol, resorcin and pyrogallol, and derivatives thereof which are substituted by a halogen atom, an aryl group, an amino group, an alkyl group containing 1 to 6 carbon atoms, an alkoxy group, etc.

The developer as used in this development can further contain conventional additives such as an alkali, e.g., sodium hydroxide, potassium hydroxide, triethanolamine, etc., a pH buffer, e.g., sodium carbonate, potassium carbonate, potassium silicate, sodium tertiary phosphate, etc., an anti-foggant, e.g., potassium bromide, a mercapto compound, a triazole, etc., a water softening agent, e.g., EDTA, sodium polyphosphate, etc., a preservative, e.g., sodium sulfite, ethanolamine, etc.

The development using such a developer (First Development) is generally carried out at a developer temperature of 20° C. to 50° C., more preferably 24° C. to 40° C., for a period of time of 10 to 120 seconds, more preferably 10 to 40 seconds.

As a fixer, fixers conventionally employed for silver halide light-sensitive materials which contain a solvent for silver halide, such as sodium thiosulfate, sodium sulfite, Rhodan ammonium, ammonium thiosulfate, etc., a pH buffer, etc., can be used. The fixation is carried out at room temperature for 1 to 30 seconds, preferably 10 seconds or less.

Second Development is carried out by using a developer which is suitable for the non-silver light-sensitive layer. It is effected at a temperature of 15° C. to 50° C., more preferably 15° C. to 40° C. for a period of 10 to 120 seconds, more preferably 10 to 45 seconds.

Hereinafter, the washing-out step will be explained in greater detail, which most characterizes the method of this invention.

According to the method of this invention, the step of washing out the gelatino-silver halide light-sensitive emulsion layer is carried out in the presence of one or more proteolytic enzymes. The description "in the presence of" as used herein includes embodiments where the proteolytic enzyme is present in the gelatino-silver halide light-sensitive emulsion layer during washing-out processing and embodiments where the proteolytic enzyme is dissolved in the aqueous solution which is used as the processing liquid to effect washing-out.

The former embodiment includes a procedure wherein the proteolytic enzyme which has been inactivated to the gelatin has been previously incorporated into the gelatino-silver halide light-sensitive emulsion layer. For example, the proteolytic enzyme can be treated with a solution which has a low pH, e.g., 4 or less, containing sulfuric acid and then be incorporated into the gelatino-silver halide light-sensitive emulsion layer maintained at a low pH (5 or less), and the resulting emulsion is then coated on the non-silver light-sensitive layer; and a procedure wherein the proteolytic enzyme has been dissolved in the fixer and fixing carried out using the fixer so that the gelatino-silver halide light-sensitive emulsion layer contains the proteolytic enzyme.

The latter embodiment includes a procedure wherein the washing-out of the gelatino-silver halide light-sensitive emulsion layer is carried out in two baths: a first bath and second bath in which the proteolytic enzyme is incorporated in the second bath or both the first bath and the second bath.

Preferred among these procedures is the embodiment wherein the proteolytic enzyme is incorporated into the processing liquid used for washing-out.

The proteolytic enzyme used in this invention is a vegetable or animal enzyme which hydrolyzes proteins such as gelatin. More specifically, the enzyme which can reduce the viscosity of an aqueous solution of gelatin can be used. For example, the enzyme which is able to reduce the original viscosity of an aqueous gelatin solution to 4/5 or less as determined by adding 1 ml of a 0.1% (wt) aqueous solution of an enzyme to 20 ml of a 10% (wt) aqueous solution of gelatin at 40° C. and stirring the mixture for 15 minutes at 40° C. can be used in the present invention. Examples of such enzymes are ficin, papain, pepsin, trypsin, etc., and various such enzymes as are available on the market, e.g., Takamine, Ht (produced by Miles Laboratories), Bioplase PN-4 (produced by Nagase Biochemical Industries, Ltd.) and Pronase P (produced by Kaken Kagaku K.K.). They can be used singly or in combination with each other.

Proteolytic enzymes which hydrolyze gelatin are described in Japanese Patent Publication 36205/70, Japanese Patent Application (OPI) 97738/77, *Research Disclosure*, Volume 150, published Oct., 1976 No. 15025, British Patents Nos. 1,179,769 and 1,354,186, U.S. Pat. Nos. 3,515,551, 3,565,618, 3,620,737, 3,832,178, etc., and these can of course be used in this invention.

As indicated, the proteolytic enzyme is preferably added to the processing liquid for the washing-out. The processing liquid is a 0.001 to 10% by weight aqueous solution and is employed at a temperature of from 20° C. to 60° C., preferably from 30° C. to 50° C. The processing time is 10 to 60 seconds, more preferably 10 to 30 seconds. To this processing liquid can further be added, if desired, inorganic salts such as calcium chloride, zinc chloride and sodium sulfite, organic acid salts such as sodium citrate and sodium acetate, polypeptide hydrogen bond-breaking agents such as urea and derivatives thereof, potassium thiocyanide, etc.

The thus-obtained lithographic printing plate is covered with a gumming agent, generally an acidic aqueous solution of gum arabic, by conventional procedures, with printing then being carried out by conventional methods.

The following examples are given to illustrate this invention in greater detail. All percents are by weight.

EXAMPLE 1

A 2S aluminum plate which had been mechanically sand grained was soaked in a 2% aqueous solution of sodium hydroxide maintained at 40° C. for one minute to partly etch the surface thereof. After water washing, the aluminum plate was soaked in a sulfuric acid-chromic acid solution comprising 50 g of sulfuric acid and 100 g of chromic acid dissolved in 700 g of water for about one minute at 25° C. to expose the surface of pure aluminum.

The thus-processed aluminum plate was then immersed in 20% aqueous sulfuric acid maintained at 30° C. and anodized for 2 minutes at a direct current voltage of 1.5 V and a current density of 3 $A/dm^2$, it was then washed with water and dried.

On the thus-anodized aluminum plate there was continuously coated a light-sensitive solution having the following formulation using a roll coater so that the dry weight after drying at 100° C. for 2 hours was about 2 $g/m^2$ to thereby provide a non-silver light-sensitive layer.

| Composition of Light-Sensitive Solution | | |
|---|---|---|
| Naphthoquinone-1,2-diazido (2)-5-sulfonic acid ester of acetone-pyrogallol resin (synthesized by the method described in Example 1 of U.S. Pat. No. 3,635,709) | 2.5 | g |
| Hitanol #3110 (cresol-formaldehyde resin, produced by Hitachi Chemical Co., Ltd.) | 5.0 | g |
| Methyl Ethyl Ketone | 75 | g |
| Cyclohexanone | 60 | g |

Thereafter, a light-sensitive solution having the composition given below was continuously coated by the bar coating on the above-prepared non-silver light-sensitive layer in such a manner that the dry weight was 4.5 $g/m^2$ and dried with hot air at 80° C. for 1 minute and then at 110° C. for 1 minute. This sample was designated No. 1.

| Composition of Light-Sensitive Solution | |
|---|---|
| Emulsion prepared by dispersing 45 g of phenol-formaldehyde resin (MP 120 H, produced by Gunei Chemical Industries Ltd.) dissolved in mixed solution of 330 g of ethyl acetate and 120 g of methyl ethyl ketone in 600 ml of a 10% aqueous solution of gelatin containing 60 ml of a 10% solution of sodium nonyl-benzene sulfonate and 150 ml of a 10% methanol solution of Turkey red oil | 1,300 g |
| Silver chlorobromide gelatin emulsion (silver chlorobromide: $Cl^-$ 70 mol% and $Br^-$ 30 mol%; average grain diameter: $0.28\mu$; gelatin per 1 kg of emulsion: 55 g; silver halide content: 0.85 mol) | 2,000 g |
| 0.1% Methanol solution of 1,3-diethyl-5-[2-{3-(3-sulfopropyl)benzoxazole-2-iridene}ethylidene]thiohydantoin sodium salt | 100 ml |
| 0.5% Aqueous alkali solution of 4-hydroxy-6-methyl-1,3,3a,7-tetrazaindene | 200 ml |
| 2% Aqueous solution of 2,4-dichloro-6-hydroxy-s-triazine | 70 ml |

Sample No. 1 was allowed to stand at room temperature for one week and thereafter it was processed as follows to produce a printing plate.

Figure images were reduced to about 1/5 the original size and photographed to obtain a transparent negative film. This film was enlarged to 5 times using an enlarger equipped with a 300 lux light source under the conditions of 80 lux.sec (C.M.S.) and projected onto Sample 1 for 10 seconds.

The sample was subjected to the following processing using an automatic developing machine:

Through Developer (I) having the following composition at 32° C. for 20 seconds;

Through Fixer (I) having the following composition at 20° C. for 10 seconds;

Through an ultraviolet exposure zone equipped with three reflector type mercury lamps (each 400 watt) and exposed for 15 seconds at a distance of 5 cm;

Through Washing Liquid (II) having the following composition at 40° to 45° C. in a washing zone while rubbing with a Nylon brush at a line speed of 30 m/minute;

Passed between squeeze rollers;

Through Developer (II) having the following composition at 30° C. for 30 seconds;

Coated with an aqueous gum arabic solution (14° Bé) to obtain Printing Plate A.

| Composition of Developer (I) | | |
|---|---|---|
| Water | 700 | ml |
| p-(Monomethylamino)phenol Sulfate | 3.0 | g |
| Sodium Sulfite | 45.0 | g |
| Hydroquinone | 12.0 | g |
| Sodium Carbonate (monohydrate) | 80.0 | g |
| Potassium Bromide | 2 | g |
| Water to make | 1 | l |

This was used after being diluted to 2 liters with water.

| Composition of Developer (II) | |
|---|---|
| Sodium Silicate JIS No. 1 | 100 g |
| Sodium Metasilicate | 50 g |
| Pure Water | 1,800 ml |
| Composition of Fixer (I) | |
| Water | 700 ml |
| Ammonium Thiosulfate | 224 g |
| Sodium Thiosulfate | 20 g |
| Water to make | 1 l |
| Composition of Washing-Out Solution (I) | |
| Bioplase PN-4 (an alkaline protease, produced by Nagase Biochemical Industries, Ltd.) | 5 g |
| Water | 1 l |

Printing Plate B was produced in the same manner as described above except that hot water was used in place of the solution containing Bioplase as the washing out solution.

Printing Plate A and Printing Plate B were each placed on a Heidelberg KOR printing machine and used in printing. With Printing Plates A and B, the third sheet of paper from the start of printing was already of high quality and about 110,000 reproductions were obtained.

These printing plates were allowed to stand at 45° C. and at a relative humidity of 80% RH for one day and, thereafter, they were used in printing in the same manner as described above. With Printing Plate A, the 7th sheet of paper from the start of printing was of acceptable quality in ink density whereas with Printing Plate B, 80 sheets of paper were required to obtain a reproduction of the same quality as obtained with Printing Plate A at 7 sheets.

In accordance with the method of this invention, 20 sheets of Sample No. 1 having a size of 1003×800 mm were processed using an automatic developing machine to obtain printing plates of the same quality as Printing Plate A. On the other hand, where the hot water washing-out solution containing no Bioplase was used, small pieces of gelatin began to float in the washing-out solution when about 3 sheets of Sample No. 1 were processed and, furthermore, spot-like stains were formed on the printing plate obtained, resulting in the formation of ink-free spots in the images.

EXAMPLE 2

The light-sensitive lithographic printing plate (Sample No. 1) as obtained in Example 1 was processed as follows:

Enlargement and exposure were carried out in the same manner as in Example 1. The thus-exposed light-sensitive lithographic printing plate was passed through Developer (I) at 32° C. for 20 seconds, Fixer (II) as described below at 20° C. for 7 seconds and an ultraviolet exposure zone for 15 seconds as per Example 1 in an automatic developing machine. Developer (I) was the same as used in Example 1.

| Composition of Fixer (II) | |
|---|---|
| Water | 700 ml |
| Ammonium Thiosulfate | 224 g |
| Sodium Sulfite | 20 g |
| Pronase P (produced by Kaken Kagaku K.K.) | 1 g |
| Water to make | 1 l |

The plate was then passed to a washing-out zone where the plate was passed through squeeze rollers where it was brushed using hot water maintained at 40° to 45° C. Thereafter, it was passed through Developer (II) which had the same composition as in Example 1 at 30° C. for 30 seconds and then coated with an aqueous gum arabic solution (14° Bé) using Gum Coater 800 G as per Example 1 to thereby obtain Printing Plate C. In the same manner as in Example 1, 20 printing plates of the 1003×800 mm size were continuously passed through. The printing plate obtained was normal and caused no scum in the washing-out solution.

This printing plate was placed on a Heidelberg KOR printing machine and used in printing as per Example 1. The 4th sheet of paper from the start of printing was of good quality.

Printing Plate C was allowed to stand at 45° C. and a relative humidity of 80% RH for one day and, thereafter, it was used in printing. The 4th or 5th sheet of paper from the start of the printing provided excellent printed matter.

While the invention has been described in detail and with reference to specific embodiments thereof, it will be apparent to one skilled in the art that various changes and modifications can be made therein without departing from the spirit and scope thereof.

What is claimed is:

1. In a process for producing a lithographic printing plate from a light-sensitive element comprising a support with a hydrophilic surface, a non-silver light-sensitive layer provided on the support which forms a water-insoluble lipophilic image and a gelatino-silver halide light-sensitive emulsion layer on the non-silver light-sensitive layer which comprises the steps of:
   (a) imagewise exposing the light-sensitive element;
   (b) developing the gelatino-silver halide light-sensitive emulsion layer to form a silver image;
   (c) exposing the non-silver light-sensitive layer to radiation to which it is sensitive;
   (d) washing out the developed gelatino-silver halide light-sensitive emulsion layer; and
   (e) developing the non-silver light-sensitive layer to remove either exposed area or unexposed area of said non-silver light-sensitive layer thereby obtaining a lithographic plate comprising the water-insoluble lipophilic image, the improvement where the washing-out of step (d) is carried out in the presence of a proteolytic enzyme.

2. The process according to claim 1, wherein said proteolytic enzyme is present in the gelatino-silver halide light-sensitive layer.

3. The process according to claim 1, wherein said proteolytic enzyme is present in the processing liquid for the washing-out.

4. The process according to claim 1, wherein said non-silver light-sensitive layer comprises an o-naphthoquinonediazide compound and an alkali-soluble resin.

5. The process according to claim 4, wherein said gelatino-silver halide light-sensitive emulsion layer is provided directly on said non-silver light-sensitive layer and a water-soluble lipophilic resin is dispersed in a fine particle form in the emulsion layer.

6. The process according to claim 5, wherein said proteolytic enzyme is present in the processing liquid for the washing-out.

7. The process according to claim 6, wherein said processing liquid for the washing-out comprises an aqueous solution containing 0.001 to 10% by weight of a proteolytic enzyme.

8. The process according to claim 7, wherein said washing out of step (d) is carried out using said processing liquid at a temperature of from 20° C. to 60° C. for a processing time of 10 to 60 seconds.

9. The process according to claim 7, wherein said washing out of step (d) is carried out using said processing liquid at a temperature of from 30° C. to 50° C. for a processing time of 10 to 30 seconds.

10. A process for producing a lithographic printing plate from a light-sensitive element comprising a support having a hydrophilic surface, a non-silver light-sensitive layer on the support which forms a water-insoluble lipophilic image and a gelatino-silver halide light-sensitive emulsion layer on the non-silver light-sensitive layer, comprising the steps of:
   (a) imagewise exposing the element to light, to which the gelatino-silver halide light-sensitive layer is sensitive, in order to form a latent image on the gelatino-silver halide light-sensitive emulsion layer;
   (b) developing the element to form a silver image on the gelatino-silver halide light-sensitive emulsion layer;
   (c) exposing the element to radiation, to which the non-silver light-sensitive layer is sensitive, in order to form the water-insoluble lipophilic image on the non-silver light-sensitive layer;
   (d) washing the element in an aqueous solution containing 0.001% to 10% by weight of proteolytic enzyme at a temperature of from 20° C. to 60° C. for 10 to 60 seconds in order to wash out the developed gelatino-silver halide light-sensitive emulsion layer;
   (e) developing the non-silver light-sensitive layer to remove either exposed area or unexposed area of said non-silver light-sensitive layer thereby obtaining a lithographic plate comprising the water-insoluble lipophilic image.

* * * * *